(12) United States Patent
Maier

(10) Patent No.: US 9,472,486 B2
(45) Date of Patent: Oct. 18, 2016

(54) CIRCUIT DEVICE AND METHOD OF MANUFACTURING A CIRCUIT DEVICE FOR CONTROLLING A TRANSMISSION OF A VEHICLE

(71) Applicant: ZF Friedrichshafen AG, Friedrichshafen (DE)

(72) Inventor: Thomas Maier, Neunburg vorm Wald (DE)

(73) Assignee: ZF FRIEDRICHSHAFEN AG, Friedrichshafen (DE)

( * ) Notice: Subject to any disclaimer, the term of this patent is extended or adjusted under 35 U.S.C. 154(b) by 0 days.

(21) Appl. No.: 14/898,798

(22) PCT Filed: May 26, 2014

(86) PCT No.: PCT/EP2014/060779
§ 371 (c)(1),
(2) Date: Dec. 16, 2015

(87) PCT Pub. No.: WO2014/206666
PCT Pub. Date: Dec. 31, 2014

(65) Prior Publication Data
US 2016/0172267 A1    Jun. 16, 2016

(30) Foreign Application Priority Data

Jun. 27, 2013  (DE) .......................... 10 2013 212 398

(51) Int. Cl.
*H01L 23/367* (2006.01)
*H01L 23/04* (2006.01)
*H01L 23/31* (2006.01)
*H01L 23/498* (2006.01)
(Continued)

(52) U.S. Cl.
CPC ....... *H01L 23/3675* (2013.01); *F16H 61/0006* (2013.01); *H01L 23/04* (2013.01);
(Continued)

(58) Field of Classification Search
CPC ........ H05K 7/14; H05K 7/20; H05K 5/0082; H05K 1/02; H05K 1/05; H05K 1/0206; H05K 7/20454; B60R 16/02; F16H 59/02; H01L 23/3675; H01L 23/49838; H01L 23/04; H01L 23/50; H01L 23/3107; H01L 2924/0002; H01L 2924/00; H01L 23/4334
USPC ....... 257/713, 712, 717, 720, 710, 704, 707, 257/708, 709, 675, 723, 685, 686
See application file for complete search history.

(56) References Cited

U.S. PATENT DOCUMENTS

2005/0133902 A1    6/2005  Pavier et al.
2006/0103240 A1*   5/2006  Naito .................. B60C 23/0408
                                                   307/10.1
(Continued)

FOREIGN PATENT DOCUMENTS

DE    10 2010 015 095 A1    4/2010
DE    10 2010 030 525 A1    6/2010
DE    10 2011 007 300 A1    4/2011

OTHER PUBLICATIONS

International Search Report issued on Dec. 4, 2014 in International Application No. PCT/EP2014/060779 (English language, 2 pages).
International Search Report issued on Dec. 4, 2014 in International Application No. PCT/EP2014/060779 (German language, 11 pages).
German Office Action dated Mar. 20, 2014 for DE 10 2013 212 398.1, (German language, 5 pages).
Translation of p. 5 of Search Report dated Mar. 20, 2014 for DE 10 2013 212 398.1 (2 pages).

*Primary Examiner* — Alexander Oscar Williams
(74) *Attorney, Agent, or Firm* — Brinks Gilson & Lione

(57) ABSTRACT

A circuit device for controlling a transmission of a vehicle comprises an integrated circuit, which is mounted with a first surface on a first support surface of a circuit substrate and on a second surface opposite to the first surface comprises a heat-conducting surface for dissipating heat from the integrated circuit, in particular wherein the heat-conducting surface is designed as a contacting surface for contacting a heat sink.

18 Claims, 3 Drawing Sheets

(51) Int. Cl.
    *H01L 23/50*     (2006.01)
    *F16H 61/00*     (2006.01)
    *H01L 23/373*    (2006.01)
    *H01L 23/36*     (2006.01)
    *H01L 23/433*    (2006.01)

(52) U.S. Cl.
    CPC ........... *H01L23/3107* (2013.01); *H01L 23/36* (2013.01); *H01L 23/3735* (2013.01); *H01L 23/49838* (2013.01); *H01L 23/50* (2013.01); *H01L 23/4334* (2013.01); *H01L 2924/0002* (2013.01)

(56) References Cited

U.S. PATENT DOCUMENTS

| | | |
|---|---|---|
| 2008/0074236 A1* | 3/2008 | Rebholz-Goldmann ......... G07C 9/00944 340/5.72 |
| 2009/0236707 A1 | 9/2009 | Chen et al. |
| 2010/0284155 A1 | 11/2010 | Stolze et al. |
| 2011/0013370 A1 | 1/2011 | Oota |
| 2011/0228478 A1 | 9/2011 | Takata et al. |

\* cited by examiner

CIRCUIT DEVICE AND METHOD OF MANUFACTURING A CIRCUIT DEVICE FOR CONTROLLING A TRANSMISSION OF A VEHICLE

RELATED APPLICATIONS

This application is a filing under 35 U.S.C. §371 of International Patent Application PCT/EP2014/060779, filed May 26, 2014, and claims the priority of German Patent Application DE 10 2013 212 398.1, filed Jun. 27, 2013, both of which are incorporated by reference herein in their entirety.

BACKGROUND

1. Technical Field

The present invention relates to a circuit device for controlling a transmission of a vehicle and a method for manufacturing a circuit device for controlling a transmission of a vehicle.

2. Background Information

Due to increased construction space requirements, electronic components are permanently subject to the trend to become smaller while maintaining the same or increasing functional scope. Thus, the power density in the component increases, which requires a further development of existing solutions or the use of new concepts to meet the increased thermal requirements.

In today's highly integrated circuits, or ICs (English IC=Integrated Circuit), where greater power losses occur, there are two constraints that must be taken into account and that limit the maximum possible power density. On the part of the integrated module or IC, a specified maximum junction temperature must not be exceeded even at the maximum ambient temperature and the resulting maximum power dissipation. This would otherwise result in damage to the device or to an operation outside the specified range. The second constraint is that a maximum temperature at the soldered connection at maximum ambient temperature and power dissipation must be taken into account, at which it can still be ensured that the soldered connection is not damaged. Assuming today's soldering technology, the maximum possible soldered connection temperature is significantly below the maximum junction temperature.

BRIEF SUMMARY OF THE INVENTION

Against this background, the present invention provides an improved circuit device for controlling a transmission of a vehicle and an improved method for manufacturing a circuit device for controlling a transmission of a vehicle according to the principle claims. Advantageous embodiments result from the dependent claims and the following description.

If a circuit device comprises an integrated circuit, the cooling connection of which is located on a side opposite to a soldered connection of the integrated circuit, very great (heat) power can be dissipated. Such circuit devices can be realized with higher power densities.

Since according to the approach presented here thermal decoupling or heat dissipation of the integrated circuit is effected—instead of by the solder connections through the circuit board—by direct connection to a heat sink, the circuit boards or the soldered connection temperature can be significantly reduced. Accordingly, a maximum junction temperature can be utilized, wherein the critical soldered connection temperature can still remain at a low level.

According to the circuit concept presented here, very compact arrangements can be realized. For example, further components or connecting terminals can be placed on a side of a printed board opposite to the soldered connection of the integrated circuit.

A circuit device for controlling a transmission of a vehicle comprises an integrated circuit which is attached with a first surface to a first board surface of a circuit board and on a second surface opposite to the first surface comprises a heat conduction area for conducting heat from the integrated circuit, particularly wherein the heat conducting surface is formed as a contacting surface for contacting a heat sink.

The circuit device can be used for transmission control of a road-bound vehicle such as a passenger car or a truck. Under the circuit device can be understood a printed circuit board assembly or an electrical device, such as a control unit. The circuit device may include an interface to the transmission. The integrated circuit or IC may comprise a plurality of electronic components arranged on a central chip, which are suitable for the control of the transmission of the vehicle. The integrated circuit may include a housing and connection wires for the electrical connection to the printed circuit board or the circuit substrate. The integrated circuit can be a highly integrated circuit. The substrate surface of the circuit board can be designed both for the electrical connection and the material attachment to the integrated circuit. For example, the integrated circuit can be attached with its first surface to the substrate surface of the circuit board by means of a soldered connection. The first and second surfaces of the integrated circuit can be the opposite main surfaces, i.e. the two lateral surfaces with the greatest extension of all the side surfaces of the integrated circuit. Because of its exposed position on the outside of the integrated circuit, the heat conducting surface can also be called exposed pad. The heat conducting surface can be so arranged on the housing or in a recess of the housing of the integrated circuit that the heat to be dissipated can be optimally conducted from an interior of the integrated circuit to the outside to a heat sink. The advantageous configuration of the circuit device with respect to the arrangement of the heat conducting surface on a lateral surface of the integrated circuit facing away from the circuit board can be referred to as a reverse connection of the integrated circuit.

In particular, the integrated circuit can comprise at least a voltage regulator and an output stage element. This embodiment of the integrated circuit as a system basis chip has the advantage that different functions can be combined in the smallest space with maximum electric power.

According to one embodiment, the circuit device can comprise the heat sink, which is connected to the heat conducting surface of the integrated circuit. For example, the heat conducting surface can be connected to the heat sink directly or via an intermediate layer. The heat sink can be wholly or partially made of metal. Advantageously, the heat sink can be arranged so that the heat to be conducted away from the integrated circuit is conducted by the circuit substrate. Using the heat sink, the waste heat can be dissipated from the integrated circuit. Thus, the service life of the integrated circuit can be extended in a simple manner.

For example, the circuit device can have a housing. In this case, the integrated circuit can be arranged within the housing, and a second side of the housing facing the second surface of the integrated circuit can form the heat sink. The second surface of the integrated circuit and the housing wall can be arranged parallel or substantially parallel to each other. The housing wall can be made completely or partially of metal. Since the housing or the housing wall is used as a heat sink, an additional heat sink can be dispensed with. This results in weight and space advantages.

According to an embodiment of the circuit device, between the heat conducting surface of the integrated circuit and the heat sink can be arranged a thermally conductive material. The thermally conductive material can be designed in the form of a layer adjacent to the heat conducting surface. The layer may be designed in a width of the heat conducting area or slightly wider. In addition to the advantage of a supporting and stabilizing function for the integrated circuit, this embodiment allows to realize an even faster and more targeted dissipation of waste heat from the component to be cooled.

According to an embodiment of the circuit device, a second surface of the circuit board opposite to the first surface can comprise at least one terminal for contacting an electronic component and/or an external power supply of the integrated circuit. The electronic component can be any additional component of the circuit device. On the second substrate surface can also be provided additional terminals for connecting a plurality of different electronic components. This embodiment has the advantage that additional components can be arranged on the circuit device in a particularly space-saving manner, because due to the advantageous reverse connection the cooling of the integrated circuit can be carried out completely through the first substrate surface of the circuit board and the second substrate surface is thus entirely available for free use.

According to a particular embodiment, the circuit device can comprise a plastic coating, which extends over at least a section of the circuit substrate and at least a section of the heat sink. For example, the plastic coating can be formed to completely cover the circuit board and the housing. This embodiment can at the same time and in a simple manner ensure a shock protection for the integrated circuit and an optimal connection of the heat sink to the heat conducting surface.

A manufacturing method for manufacturing a circuit device for controlling a transmission of a vehicle comprises the following steps:

Providing an integrated circuit having a first surface and a second surface opposite the first surface, having a heat conducting surface for dissipating heat from the integrated circuit, in particular wherein the heat conducting surface is formed as a contacting surface for contacting a heat sink;

Arranging the integrated circuit with the first surface on a first surface of a circuit substrate, and Connecting the first surface of the integrated circuit with the first surface of the circuit substrate, in particular wherein the connecting is carried out as an integral connection.

The step of connecting can be carried out, for example, by means of an integrally executed soldering.

BRIEF DESCRIPTION OF THE DRAWINGS

The invention is illustrated by way of example with reference to the accompanying drawings. The drawings show.

DETAILED DESCRIPTION OF THE DRAWINGS AND THE PRESENTLY PREFERRED EMBODIMENTS

Figure 1:
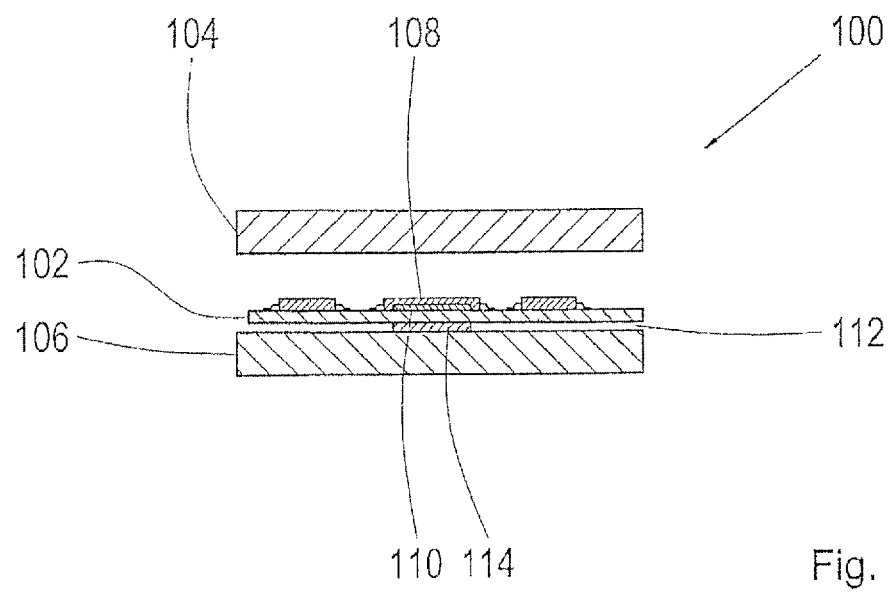
FIG. 1 shows a representation of a cooling connection of an integrated circuit according to the prior art.

In the following description of the preferred embodiments of the present invention, the same or similar reference numerals are used for the elements that are shown in the various figures and act similarly, while a repeated description of these elements is dispensed with.

FIG. 1 shows a view of a section of a circuit device 100 with conventional cooling connection of an integrated circuit. Shown is a circuit substrate 102, which is arranged between a top side 104 and a bottom side 106 of a circuit housing made of metal. On a surface of the circuit substrate or the circuit board 102 is arranged, besides other components, a highly integrated system basis chip 108 with a heat conducting surface 110. The heat conducting surface 110, which is also called the exposed pad, is located on a surface of the system basis chip 108 facing the circuit substrate 102 and is adjacent to a surface of the circuit substrate 102. The bottom side 106 of the circuit housing fragmentary shown serves here as a heat sink. A gap between the circuit substrate 102 and the bottom housing wall side 106 forms one of several thermal vias 112, in which is arranged a layer of a thermally conductive material 114.

In the standard solution according to the prior art shown in FIG. 1, it is tried to best connect the power loss affected block 108 to the heat sink 106. For this purpose, the module or system basis chip 108 comprises the exposed pad 110, which is soldered to the printed board 102. Through the thermal vias 112 in the printed circuit board 102 and the thermally conductive material 114, also referred to as a "gap filler", between the printed circuit board 102 and the heat sink is achieved the best possible thermal connection. Particular attention is paid to the fact that the connection of the exposed pad 110 of the component housing at the inner layers the printed circuit board 102 is designed as planar as possible to dissipate or spread as much heat into the printed circuit board 102 also in this way. In most of today's ICs 108, the exposed pad 110 is on GND potential and can be full-surface connected to the circuit board layers.

Figure 2:
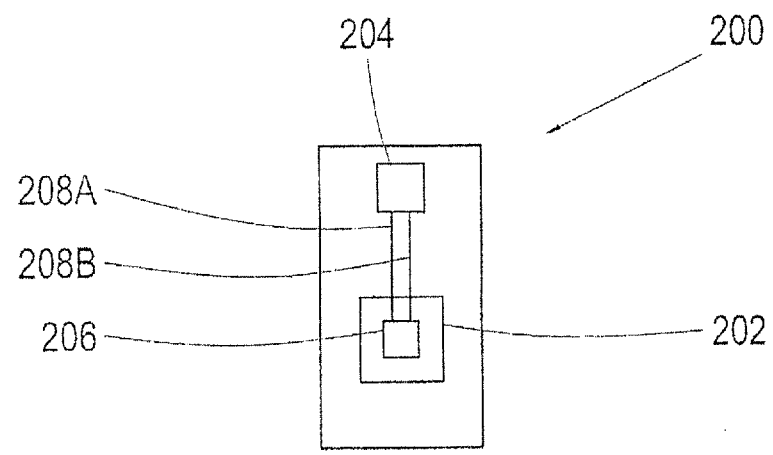
FIG. 2 shows a block diagram of a vehicle having a circuit device for controlling a transmission of the vehicle, according to an embodiment of the present invention.

FIG. 2 shows a block diagram of a vehicle 200 with an exemplary embodiment of a circuit device 202 for controlling a transmission of the 204 of the vehicle 200. The vehicle 200 is here a passenger car. Alternatively, the vehicle 200 can be a truck or a railway vehicle. The transmission 204 is designed for driving a motor of the vehicle 200. To control the transmission 204, the circuit device 202 comprises an integrated circuit 206 which is connected via two electric wires 208A, 208B to the transmission. In the transmission circuit 204 can be installed a device 202 in accordance with the approach presented here, which allows a gear change or control of the functionalities of the transmission 204. In this case, in the circuit device 202 are arranged one or more integrated circuits or ICs 206, which are, for example designed analogously to the block 108 shown in FIG. 1. In accordance with the following description with reference to FIGS. 3 to 5, these ICs can be installed on a circuit substrate and be configured for executing electronic processing of control commands.

Figure 3:
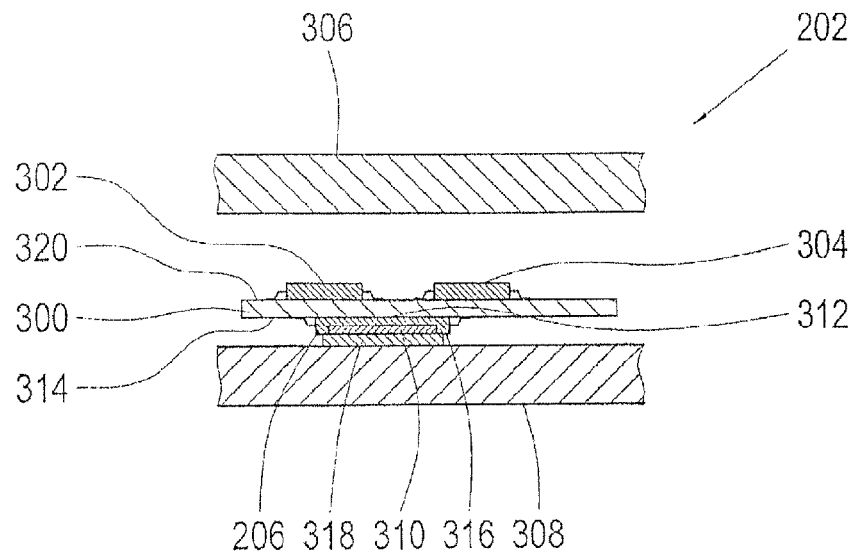
FIG. 3 shows a representation of a cooling connection of an integrated circuit in reverse construction technology, according to an embodiment of the present invention.

FIG. 3 shows, by means of a detailed view, a cooling connection of the integrated circuit 206 of FIG. 2 in reverse construction technology, according to an embodiment of the present invention. Shown is a cross-sectional side view of a section of the circuit device 202 of FIG. 2. The circuit device 202 comprises a circuit board 300, the integrated circuit 206 and a first electronic component 302 and a second electronic device 304. Further, the circuit device 202 is enclosed by a housing, of which in the representation in FIG. 3 are shown sections of a top housing wall 306 and a bottom housing wall 308. In the embodiment of the circuit device 202 shown in FIG. 3, the housing is formed of metal, and the bottom housing wall 308 forms a heat sink for dissipating heat from the integrated circuit 206. According to alternative embodiments not shown in the figures, the circuit device can comprise one or more additional heat sinks. According to the embodiment of the integrated circuit 206 shown in FIG. 3, it is designed as a system base chip with one or more voltage regulators and/or output stage elements. In this highly integrated design, the integrated circuit 206 is characterized by a high power density and a correspondingly high heat loss, which must be optimally dissipated.

The already mentioned reverse technology of connecting the integrated circuit 206 to the circuit board or the circuit substrate 300 is characterized in that a heat conducting surface 310 for dissipating heat from the integrated circuit 206 is arranged facing away from the circuit substrate 300. Accordingly, the arrangement of the circuit device 202 is configured such that a first surface 312 of the integrated circuit 206 is attached to a first surface 314 of the circuit substrate 300. In the embodiment of the circuit device 202 shown in FIG. 3, the mounting of the integrated circuit 206 on the circuit board 300 in a soldered connection. A second surface 316 of the integrated circuit 206 comprising a heat conducting surface 310 is facing the bottom housing wall side or the bottom housing wall 308. Thus, advantageously, the heat dissipation from the highly integrated circuit can be conducted here into the bottom housing wall, which forms here the heat sink, instead of—as is the case of the prior art—through a ground layer of the circuit substrate 300.

The embodiment of the circuit device 202 shown in FIG. 3 has a layer of a heat conductive material 318 which is arranged in a gap between the bottom housing wall 308 and first support surface 314. The thermally conductive material 318 is arranged between a surface of the housing's bottom wall 308 and the heat conducting surface 310 of the integrated circuit 206 in such a manner that it fits snugly on both components 308, 310. By the reverse connection of the system base chip 206 characterized by the high power dissipation to the circuit substrate 300, the heat can be conducted by the conductive material 318 directly to the heat sink or the housing 308 and need not take the way of the printed circuit board 300. This achieves a thermal decoupling of the integrated circuit 206 of the circuit substrate 300 and so can hold the heat away from the critical soldered connections on the first surface 312 of the integrated circuit 206.

That new construction concept shown in the representation of FIG. 3, in which the system base chip 206 is used in reverse construction technology, in addition to the improved heat dissipation from the system base chip 206 has the further advantage that a printed circuit board side or a second substrate surface 320 opposite to the first support surface 314 can be completely used for assembly with additional components 302, 304, because it does not need to be used for the connection of cooling elements.

Figure 4:
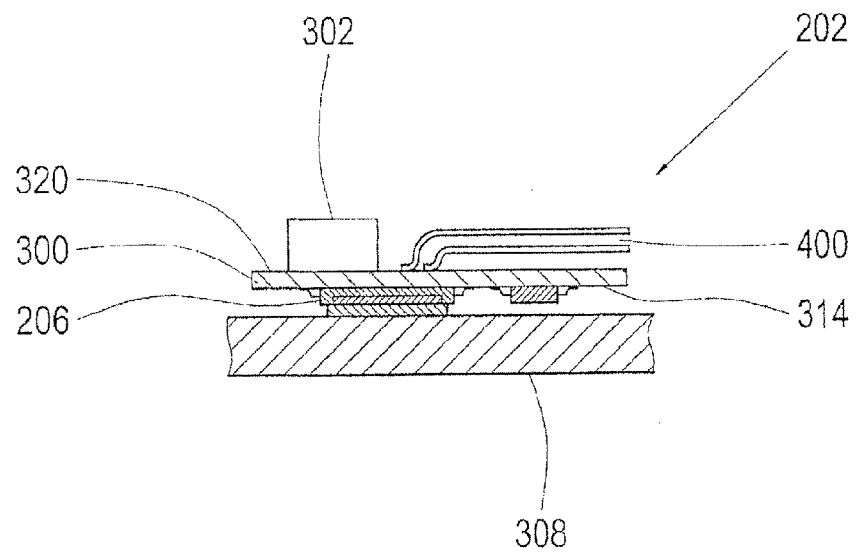
FIG. 4 is a representation of a cooling connection of an integrated circuit in reverse construction technique, according to a further embodiment of the present invention.

FIG. 4 shows, by way of a further detailed view, a further embodiment of the circuit device 202 in reverse construction technology to illustrate the various possibilities of using the second substrate surface 320 of the circuit substrate 300 now no longer required for heat dissipation.

Here an SMD plug or a surface-mounted component is arranged as the first electronic component 302 on the second substrate surface 320. In addition, the second substrate surface 320 can also be used as an arbitrary connection point to the outside. In the embodiment shown in FIG. 4 is provided, on the second substrate surface 320, a connection for an external power supply or output of the integrated circuit 206 by means of welded or soldered strands 400.

Over the strands 400, which can for example be the lines 208 A and 208 B from FIG. 2, a flow of energy between the circuit device 202 and the transmission of the vehicle can be produced. Alternatively, the strands 400 can also be used for signal transmission between the integrated circuit 206 and a transmission controller.

According to further embodiments of the invention presented here a bond or a connection possibility for a lead frame is provided on the second substrate surface 320. Here, in contrast to the example shown in FIG. 3, an additional electronic component is provided on the first support surface 314 of the circuit substrate adjacent to the system base chip 206.

Figure 5:
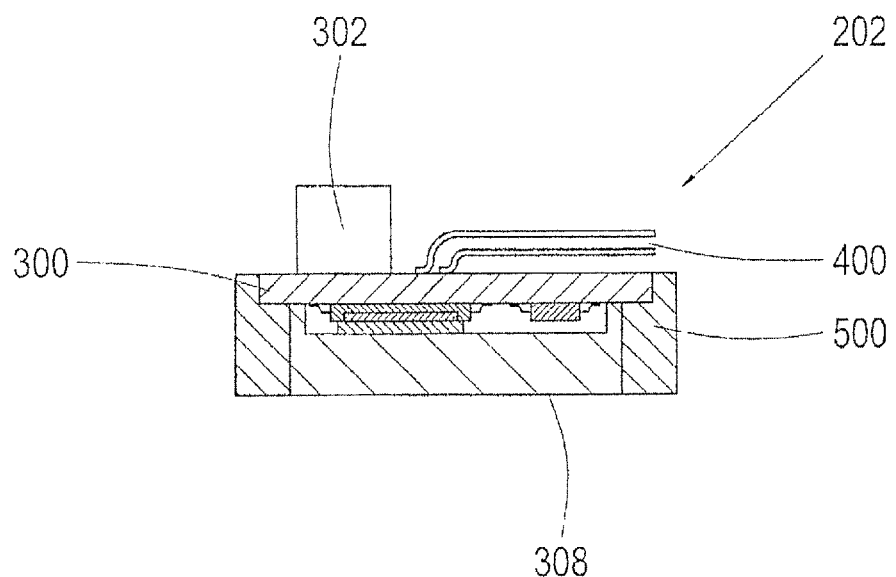
FIG. 5 is an illustration of a cooling connection of an integrated circuit in reverse construction technology with an additional coating of the circuit board, according to an embodiment of the present invention.

FIG. 5 shows, again in a fragmentary detailed representation, an exemplary extension of the embodiment of the circuit device 202 explained in FIG. 4. Here, after the completion, the circuit device 202 is provided with a plastic extrusion-molding encapsulation 500. As the diagram in FIG. 5 shows, the metal body that forms the housing and the circuit substrate 300 are at least laterally covered by the plastic extrusion-molding encapsulation 500. Thus, the circuit board 300 and the integrated circuit 206 can be stabilized and a robust connection of the circuit board 300 to the housing of the circuit device 202 can be realized.

Figure 6:
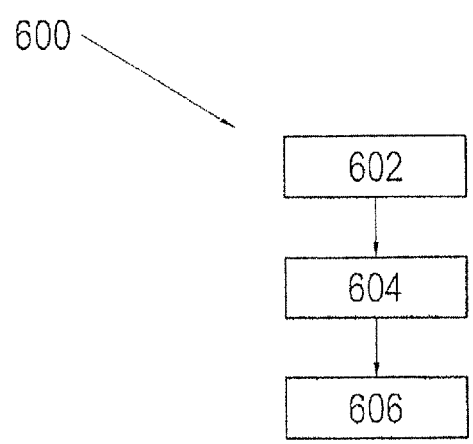
FIG. 6 is a flowchart of a manufacturing method for manufacturing a circuit device for controlling a transmission of a vehicle according to an embodiment of the present invention.

FIG. 6 shows a flow diagram of an embodiment of a manufacturing process 600 for producing a circuit device for controlling a transmission of a vehicle. The circuit device can be an embodiment of the inventive circuit device explained in FIGS. 2 to 5. In a step 602, an integrated circuit having a first surface and a second surface opposite to the first surface, which comprises a heat conducting surface for dissipating heat from the integrated circuit, is provided, in particular wherein the heat conducting surface is designed as a contacting surface for contacting the heat sink. In a step 604, the integrated circuit is arranged with the first surface on a first support surface of a circuit substrate. In a step 606, the connection of the first surface of the integrated circuit with the first support surface of the circuit substrate is produced, in particular wherein the connecting is carried out as an integral connection. The integral connection can be produced for example by soldering.

The presented structure concept of a circuit device in reverse technology allows much more compact solutions for electronic control units with high power density. The various embodiments of the inventive circuit device described with reference to the preceding figures are used in combination with external interfaces, inter alia, specifically for integrated transmission controllers.

The embodiments described and shown in the figures are chosen only by way of example. Different embodiments may be combined in whole or in terms of individual features. An embodiment can also be supplemented by features of another embodiment.

Furthermore, the process steps according to the invention may be repeated as well as executed in a sequence other than the sequence described.

If an embodiment includes an "and/or" linkage between a first feature and a second feature, it can be read so that the embodiment comprises both the first feature and the second feature according to one embodiment form, and according to another embodiment form comprises either only the first feature or the second feature.

REFERENCE NUMERALS

100 Circuit device according to prior art
102 Printed board according to prior art
104 Housing top side according to prior art
106 Bottom housing wall side according to prior art
108 Highly integrated system basis chip according to prior art
110 Heat conducting surface according to prior art
112 Via according to prior art
114 Thermally conductive material according to prior art
200 Vehicle
202 Circuit device
204 Transmission
206 Integrated circuit
208A First electric line
208B Second electric line
300 Circuit substrate
302 First electronic component
304 Second electronic component
306 Top housing wall
308 Bottom housing wall, heat sink
310 Heat conducting surface
312 First surface of the integrated circuit
314 First support surface of the circuit substrate
316 Second surface of the integrated circuit
318 Heat-conducting material
320 Second support surface of the circuit substrate
400 External power supply
500 Plastic extrusion-molding encapsulation
600 Manufacturing method for the manufacturing of a circuit device
602 Step of providing an integrated circuit
604 Step of arranging the integrated circuit on a circuit substrate
606 Step of connecting the integrated circuit with a circuit substrate

The invention claimed is:

1. A circuit device for controlling a transmission of a vehicle, the circuit device comprising:
    an integrated circuit comprising a first surface and a second surface, the second surface opposite to the first surface;
    wherein the first surface is mounted on a first support surface of a circuit substrate;
    wherein the second surface comprises a heat conducting surface facing away from the circuit substrate and for dissipating heat from the integrated circuit;
    wherein the circuit device comprises a heat sink; and
    wherein the heat conducting surface of the integrated circuit is formed as a contacting surface for contacting the heat sink.

2. The circuit device of claim 1, wherein the circuit device further comprises a housing and the integrated circuit is arranged within the housing, wherein a wall of the housing faces the second surface of the integrated circuit and forms the heat sink.

3. The circuit device of claim 1, wherein a heat-conductive material is arranged between the heat-conducting surface of the integrated circuit and the heat.

4. The circuit device of claim 1, wherein a second support surface opposite to the first support surface of the circuit substrate comprises at least one connection for making contact with an electronic component and/or an external power supply of the integrated circuit and/or for signal transmission between the integrated circuit and a transmission controller.

5. The circuit device of claim 1, wherein the circuit device further comprises a plastic extrusion-molding encapsulation which extends at least over a section of the circuit substrate and at least a section of the heat sink.

6. A method for manufacturing a circuit device for controlling a transmission of a vehicle the method comprising:
    providing an integrated circuit having a first surface and a second surface opposite to the first surface, the second surface comprising a heat conducting surface for dissipating heat from the integrated circuit that is designed as a contacting surface for contacting a heat sink;
    arranging the first surface of the integrated circuit with a first support surface of a circuit substrate; and
    integrally connecting the first surface of the integrated circuit with the first support surface of the circuit substrate.

7. The circuit device of claim 3, wherein the circuit device further comprises a housing and the integrated circuit is arranged within the housing, and wherein a wall of the housing faces the second surface of the integrated circuit and forms the heat sink.

8. The circuit device of claim 2, wherein a heat-conductive material is arranged between the heat-conducting surface of the integrated circuit and the heat sink.

9. The circuit device of claim 4, wherein a heat-conductive material is arranged between the heat-conducting surface of the integrated circuit and the heat sink.

10. The method of claim 6, the method further comprising arranging a heat-conductive material between the heat-conducting surface of the integrated circuit and the heat sink.

11. The circuit device of claim 2, wherein a second support surface opposite to the first support surface of the circuit substrate comprises at least one connection for making contact with an electronic component and/or an external power supply of the integrated circuit and/or for signal transmission between the integrated circuit and a transmission controller.

12. The circuit device of claim 3, wherein a second support surface opposite to the first support surface of the circuit substrate comprises at least one connection for making contact with an electronic component and/or an external power supply of the integrated circuit and/or for signal transmission between the integrated circuit and a transmission controller.

13. The method of claim 6, the method further comprising arranging an electronic component and/or an external power supply of the integrated circuit on a second support surface opposite to the first support surface of the circuit substrate.

14. The circuit device of claim 2, wherein the circuit device further comprises a plastic extrusion-molding encapsulation which extends at least over a section of the circuit substrate and at least a section of the heat sink.

15. The circuit device of claim 3, wherein the circuit device further comprises a plastic extrusion-molding encapsulation which extends at least over a section of the circuit substrate and at least a section of the heat sink.

16. The circuit device of claim 4, wherein the circuit device further comprises a plastic extrusion-molding encapsulation which extends at least over a section of the circuit substrate and at least a section of the heat sink.

17. The method of claim 6, the method further comprising arranging the integrated circuit within a housing, wherein a wall of the housing faces the second surface of the integrated circuit and forms the heat sink.

18. The method of claim 6, the method further comprising arranging a plastic extrusion-molding encapsulation that extends at least over a section of the circuit substrate and at least a section of the heat sink.

\* \* \* \* \*